(12) United States Patent
Gao

(10) Patent No.: US 10,586,837 B2
(45) Date of Patent: Mar. 10, 2020

(54) ARRAY SUBSTRATE, METHOD FOR MANUFACTURING THE SAME AND DISPLAY DEVICE

(71) Applicant: BOE TECHNOLOGY GROUP CO., LTD., Beijing (CN)

(72) Inventor: Xinwei Gao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/989,681

(22) Filed: May 25, 2018

(65) Prior Publication Data

US 2019/0067390 A1 Feb. 28, 2019

(30) Foreign Application Priority Data

Aug. 24, 2017 (CN) .......................... 2017 1 0737813

(51) Int. Cl.
*H01L 29/08* (2006.01)
*H01L 27/32* (2006.01)
(Continued)

(52) U.S. Cl.
CPC ...... *H01L 27/3246* (2013.01); *H01L 51/5228* (2013.01); *H01L 51/56* (2013.01)

(58) Field of Classification Search
CPC ............. H01L 27/3246; H01L 27/3279; H01L 51/5228
See application file for complete search history.

(56) References Cited

U.S. PATENT DOCUMENTS 10,050,098 B2  8/2018  Nam et al.
10,090,370 B2  10/2018  Lee et al.
(Continued)

FOREIGN PATENT DOCUMENTS

CN  101728418 A  6/2010
CN  203631557 U  6/2014
(Continued)

OTHER PUBLICATIONS

First Office Action dated Oct. 12, 2018 corresponding to Chinese application No. 201710737813.2.
(Continued)

*Primary Examiner* — Stephen M Bradley
*Assistant Examiner* — Wasiul Haider
(74) *Attorney, Agent, or Firm* — Nath, Goldberg & Meyer; Joshua B. Goldberg; Daniel Bissing

(57) ABSTRACT

The present invention provides an array substrate, a method for manufacturing the same and a display device. The array substrate includes a substrate; a anode layer and a pixel defining layer on the substrate; an auxiliary cathode layer on the pixel defining layer; a spacer layer on the auxiliary cathode layer; an organic light-emitting layer covering the anode layer, the pixel defining layer, and the spacer layer; a cathode layer covering the organic light-emitting layer, wherein the cathode layer laps with the auxiliary cathode layer on the pixel defining layer. Since the auxiliary cathode layer disposed on the pixel defining layer corresponds to the non-display area, the material with low resistivity can be selected for the auxiliary cathode layer. Thus the uniformity of the display brightness and the like of the screen can be improved, thereby improving the display quality of the screen.

9 Claims, 6 Drawing Sheets

(51) Int. Cl.
    *H01L 51/56*    (2006.01)
    *H01L 51/52*    (2006.01)

(56) References Cited

U.S. PATENT DOCUMENTS

| | | | | |
|---|---|---|---|---|
| 2009/0009069 | A1* | 1/2009 | Takata | ............... H01L 27/3246 |
| | | | | 313/504 |
| 2017/0025610 | A1* | 1/2017 | Kwon | ................ H01L 51/0007 |
| 2017/0092863 | A1* | 3/2017 | Bower | .................... H01L 51/56 |
| 2017/0186831 | A1* | 6/2017 | Nam | ................... H01L 27/3272 |
| 2017/0278919 | A1* | 9/2017 | Matsumi | ............... H01L 27/323 |

FOREIGN PATENT DOCUMENTS

| | | | |
|---|---|---|---|
| CN | 106206646 | A | 12/2016 |
| CN | 106876426 | A | 6/2017 |
| CN | 106935594 | A | 7/2017 |
| CN | 107039491 | A | 8/2017 |

OTHER PUBLICATIONS

Second Office Action dated May 22, 2019; Corresponding to Chinese Application No. 201710737813.2; English Translation Attached.

* cited by examiner

ARRAY SUBSTRATE, METHOD FOR MANUFACTURING THE SAME AND DISPLAY DEVICE

CROSS-REFERENCE TO RELATED APPLICATION

This application claims the priority of Chinese Patent Application No. 201710737813.2 submitted on Aug. 24, 2017, the disclosure of which is incorporated herein in its entirety by reference.

TECHNICAL FIELD

The present disclosure relates to the field of display technology, particularly to an array substrate and a method for manufacturing the same, as well as a display device.

BACKGROUND

An organic light-emitting display (OLED) is a flat panel display device driven by an electric field to cause organic materials to emit light through carrier injection and recombination. Compared with the currently dominant liquid crystal display (LCD) and plasma display (PDP), OLED has the characteristics of low cost, all solid state, active light emission, high brightness, high contrast, wide viewing angle, fast response, thin thickness, low voltage DC drive, low power consumption, wide operating temperature range, soft screen display and so on, and thus is an ideal flat panel display.

Among them, the top-emitting OLED device can significantly increase the opening ratio of the OLED device while increasing the pixel PPI density, and is a hot spot for the development of the OLED high resolution display technology. However, the transparent cathode technologies such as Mg:Ag and IZO which are commonly used in current top-emitting OLED devices have a problem that a sheet resistance Rs is high, and as for the large-sized display screen, uniformity of characteristics such as screen display brightness cannot be guaranteed.

Therefore, there is still need to further improve the Rs resistance distribution of the cathode and improve the display quality of the display screen.

SUMMARY

According to an example, the present disclosure provides an array substrate, comprising:
 a substrate;
 an anode layer and a pixel defining layer on the substrate;
 an auxiliary cathode layer on the pixel defining layer;
 a spacer layer on the auxiliary cathode layer;
 an organic light-emitting layer covering the anode layer, the pixel defining layer, and the spacer layer; and
 a cathode layer covering the organic light-emitting layer;
 wherein the cathode layer laps with the auxiliary cathode layer on the pixel defining layer.

Optionally, an orthogonal projection of the pixel defining layer on the substrate covers an orthogonal projection of the auxiliary cathode layer and the spacer layer on the substrate.

Optionally, the pixel defining layer divides a plurality of pixel units arranged in an array on the substrate, and in the direction of a connecting-line of centers of adjacent pixel units, the orthogonal projection of the spacer layer on the substrate covers the orthogonal projection of the auxiliary cathode layer on the substrate.

Optionally, the spacer layer includes a plurality of spacer columns on the auxiliary cathode layer, a cross section of the spacer columns along a first direction is an inverted trapezoid, the first direction is the direction of a connecting-line of centers adjacent pixel units, wherein a short side of the inverted trapezoid is arranged adjacent the auxiliary cathode layer.

Optionally, the array substrate further comprises an insulating layer between the auxiliary cathode layer and the organic light-emitting layer, the insulating layer is on an area of the auxiliary cathode layer that is not covered by the spacer columns.

Optionally, the material of the auxiliary cathode layer is a metal conductive material, and a thickness of the auxiliary cathode layer is 100-700 nm. The sheet resistance of the metal conductive material is low (less than 1.0 Ω/square, for example, 0.2-1Ω/square), and examples thereof include Mo, Mo/Al/Mo, Cu, Ag, Nb, and the like.

Optionally, a thickness of the spacer layer is 0.2-4 μm.

According to an example, the present disclosure also provides a display device, comprising any one of the above array substrate.

According to an example, the present disclosure also provides a method for manufacturing any one of the above array substrate, comprising:
 providing the substrate;
 forming the anode layer and the pixel defining layer on the substrate by patterning;
 forming the auxiliary cathode layer on the pixel defining layer;
 forming the spacer layer on the auxiliary cathode layer;
 forming the organic light-emitting layer on the anode layer, the pixel defining layer, and the spacer layer by covering; and
 forming the cathode layer on the organic light-emitting layer;
 wherein the cathode layer laps with the auxiliary cathode layer on the pixel defining layer.

Optionally, the step of forming the organic light-emitting layer by covering comprises:
 forming the organic light-emitting layer by thermal evaporation or inkjet printing so that the organic light-emitting layer is broken at an area on the pixel defining layer adjacent the auxiliary cathode layer, and disconnected from the auxiliary cathode layer.

Optionally, the step of forming the cathode layer comprises:
 forming the cathode layer by a sputtering process so that the cathode layer laps with the auxiliary cathode layer on the pixel defining layer.

BRIEF DESCRIPTION OF THE FIGURES

In order to more clearly describe the technical solutions of the examples of the present invention, the drawings used in the description of the examples of the present invention will be briefly described below. Obviously, the drawings in the following description are merely some examples of the present invention, and for a person skill in the art, other drawings may also be obtained according to these drawings without paying any creative labor.

DETAILED DESCRIPTION

In order to make the above objects, features, and advantages of the present invention more apparent, the present invention will be further described in detail as below in conjunction with the accompanying drawings and specific examples.

Example 1

Figure 1:
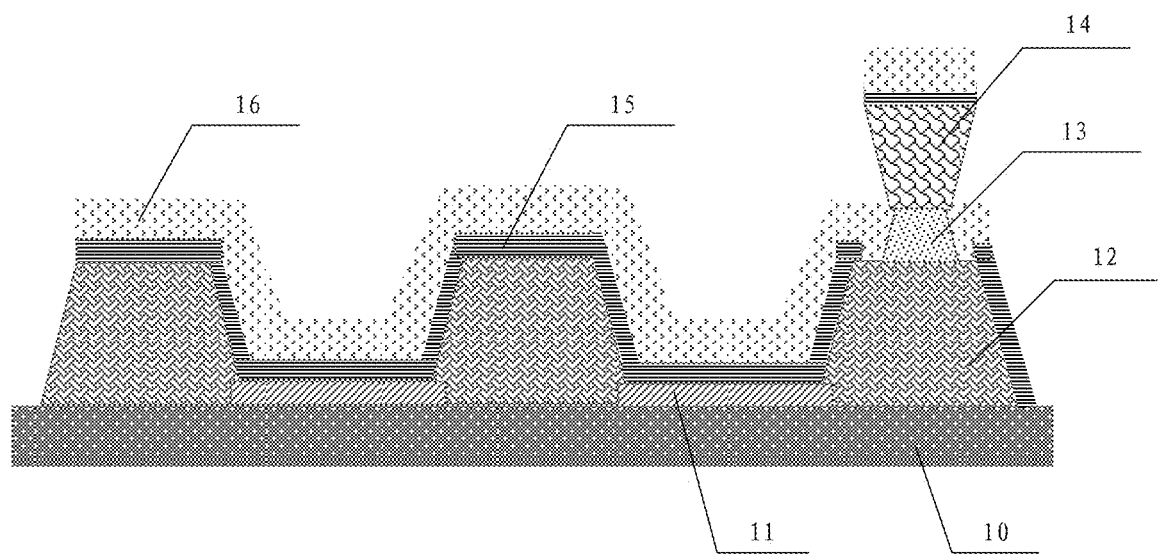
FIG. 1 is a schematic diagram showing a profile structure of an array substrate provided by example 1 of the present invention.

Referring to FIG. 1, a profile structure of an array substrate provided by Example 1 of the present application is shown, and the array substrate includes a substrate 10 and an anode layer 11 and a pixel defining layer 12 formed on the substrate 10 by patterning.

The array substrate may further include an auxiliary cathode layer 13 formed on the pixel defining layer 12 and a spacer layer 14 formed on the auxiliary cathode layer 13.

The array substrate may further include an organic light-emitting layer 15 covering the anode layer 11, the pixel defining layer 12, and the spacer layer 14.

The array substrate may further include a cathode layer 16 covering the organic light-emitting layer 15.

Specifically, the substrate 10 may be a base substrate on which a thin film transistor array is fabricated. The base substrate may be a material such as glass (e.g, backplane glass BP), resin, or the like. The substrate 10 may further include a planarization layer formed on the base substrate. Optionally, the material of the planarization layer may be the same as that of the pixel defining layer (PDL), and may be a material such as resin, SiNx, or the like.

Optionally, the material of the anode layer 11 may be a conductive material such as ITO.

The pixel defining layer 12 may have a thickness ranging from 0.2 to 1.5 μm. The pixel defining layer 12 divides a plurality of pixel units arranged in an array on the substrate 10.

Figure 2:
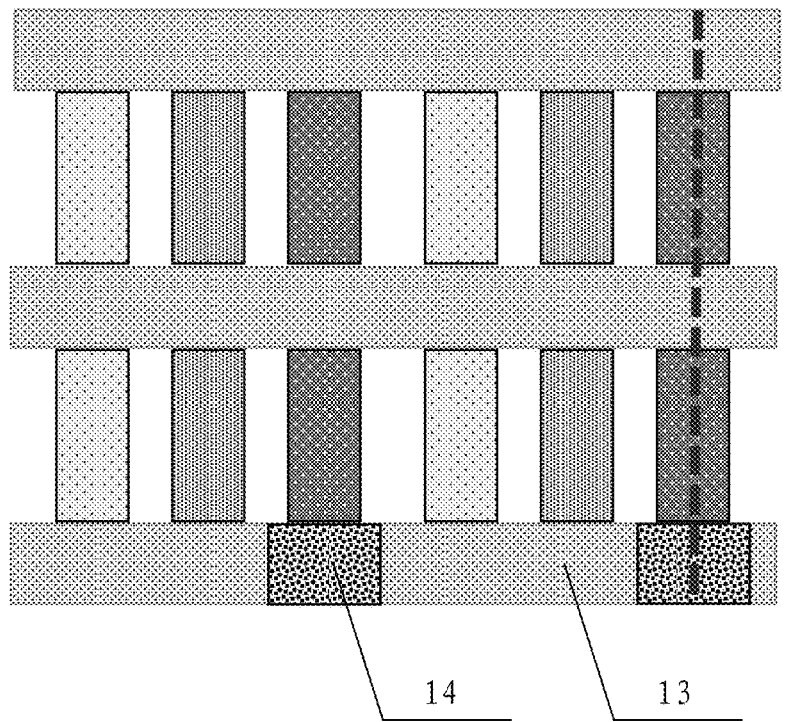
FIG. 2 is a schematic diagram showing a planar structure of an array substrate provided by example 1 of the present invention.

As shown in FIG. 2, the auxiliary cathode layer 13 may be stacked on the pixel defining layer 12, therefore, corresponding to the structure of the pixel defining layer 12, a plurality of auxiliary cathode strips arranged in parallel may be included, and a plurality of auxiliary cathode strips arranged in a array may also be included, wherein the auxiliary cathode strips are connected in series around the panel. Optionally, the material of the auxiliary cathode layer 13 may be a metal conductive material such as Mo, Mo/Al/Mo, Cu, Ag, and Nb, and the auxiliary cathode layer 13 may have a thickness of from 100 to 700 nm.

The spacer layer 14 may be stacked on the auxiliary cathode layer 13. In one example, the spacer layer 14 may include a plurality of spacer strips corresponding to the auxiliary cathode strips described above. In another example, the spacer layer 14 may further include a plurality of discrete spacer columns, wherein each pixel may be correspondingly provided with one spacer column, or a plurality of pixels may be correspondingly provided with one spacer column, as shown in FIG. 2. Optionally, the thickness of the spacer layer 14 may have a thickness of from 0.2 to 4 μm.

The cathode layer 16 may be a single-layer cathode composed of a material such as IZO, ITO, AZO, and the like, and may also be a composite cathode composed of a first layer cathode material such as Mg:Ag, Ag and the like, and a material such as IZO, ITO, AZO, and the like. When the cathode layer 16 is a single-layer cathode, the thickness can be 300-1,000 nm; when the cathode layer 16 is a composite cathode, the first layer cathode material such as Mg; Ag, Ag and the like is required to be on the side of the organic layer and the thickness is 2-20 nm. The cathode materials such as IZO, ITO, AZO and the like cover the first layer cathode material and the thickness is in the range of 300-1000 nm.

In order to prevent the arrangement of the auxiliary cathode layer 13 and the spacer layer 14 from affecting the aperture ratio, optionally, the orthogonal projection of the pixel defining layer 12 on the substrate 10 covers an orthogonal projection of the auxiliary cathode layer 13 and the spacer layer 14 on the substrate 10.

There is a variety of structures that can allow the cathode layer 16 to lap with the auxiliary cathode layer 13 on the pixel defining layer 12. For example, the organic light-emitting layer 15 may be patterned such that it is disconnected from the auxiliary cathode layer 13 so as to render the cathode layer 16 lap with the auxiliary cathode layer 13 on the pixel defining layer 12. In another embodiment, it is also possible to design the structure of the spacer layer 14, so that in the centerline direction of the adjacent pixel units, the orthogonal projection of the spacer layer 14 on the substrate 10 covers the orthogonal projection of the auxiliary cathode layer 13 on the substrate 10. For example, in the case where the above spacer layer 14 includes a plurality of spacer columns, a cross section of the spacer columns in the centerline direction of the adjacent pixel units may be an inverted trapezoid. Due to the inverted trapezoidal structure of the spacer columns, the organic light-emitting layer 15 is disconnected from the auxiliary cathode layer 13 on the pixel defining layer 12 during the formation process, thereby achieving a structure that the cathode layer 16 is continuously lapped with the auxiliary cathode layer 13 on the pixel defining layer 12. Among them, in the case where the thickness of the auxiliary cathode layer 13 is greater than the thickness of the organic light-emitting layer 15, even if the organic light-emitting layer 15 continuously forms a film around the auxiliary cathode layer 13 on the pixel defining layer 12, the portion of the auxiliary cathode layer 13 higher than the organic light-emitting layer 15 can also be lapped with the cathode layer 16. Therefore, the structure of the spacer layer 14 is not particularly limited in this application, and it may be determined and designed according to practical applications as long as the cathode layer 16 can be lapped with the auxiliary cathode layer 13 on the pixel defining layer 12.

As for the case where the above spacer layer 14 includes a plurality of spacer columns, in order to prevent the short circuit between the auxiliary cathode layer 13 among the spacer columns and the subsequently formed organic light-emitting layer 15 from affecting display characteristics, optionally, the auxiliary cathode layer 13 is covered with an insulating layer, and the insulating layer may be an organic photoresist layer or an inorganic insulating layer. The insulating layer is located on the area of the auxiliary cathode layer 13 that is not covered by the spacer columns, wherein the area that is not covered by the spacer columns refers to an area that is not covered by the orthogonal projection of the spacer columns on the substrate 10.

In the array substrate provided by the example, since the auxiliary cathode layer disposed on the pixel defining layer corresponds to the non-display area, the material with low sheet resistance (less than 1.0 Ω/square) can be selected for the auxiliary cathode layer. It is also possible to further reduce the resistance by increasing the thickness of the auxiliary cathode layer, and the IR Drop of the cathode layer lapped with the auxiliary cathode layer is also reduced accordingly. Thus the uniformity of the display brightness and the like of the screen can be improved, thereby improving the display quality of the screen.

Example 2

Example 2 of the present application provides an array substrate. Referring to FIG. 2, the auxiliary cathode layer 13 of the array substrate includes a plurality of auxiliary cathode strips arranged in parallel, and the spacer layer 14 includes a plurality of spacer columns arranged in an array on the auxiliary cathode layer 13. In this example, in the direction parallel and perpendicular to the auxiliary cathode strips, one spacer column is provided for every three sub-pixels.

The schematic view of a profile structure corresponding to the position of the dash line in FIG. 2 is shown in FIG. 1, wherein the dash line corresponds to the centerline direction of the pixel units adjacent to the spacer column, the cross section of the spacer columns along such direction is an inverted trapezoid, the short side of the inverted trapezoid is adjacent to the auxiliary cathode layer 13; and in such direction, the orthogonal projection of the spacer columns on the substrate 10 covers the orthogonal projection of the auxiliary cathode layer 13 on the substrate 10, that is, the width of long side of the inverted trapezoid is larger than the maximum width corresponding to the narrow side of the auxiliary cathode strip.

At the same time, the orthogonal projection of the pixel defining layer 12 on the substrate 10 covers the orthogonal projection of the auxiliary cathode layer 13 and the spacer layer 14 on the substrate 10, so that it can be ensured that the arrangement of the auxiliary cathode layer 13 and the spacer layer 14 does not reduce the aperture ratio, and the short circuit between the auxiliary cathode layer 13 and the anode layer 11 can be avoided.

In this example, by disposing a spacer column with an inverted trapezoidal cross-section, the organic light-emitting layer 15 is subsequently affected by the shadow effect of the inverted trapezoid during the deposition of the organic light-emitting layer 15 by thermal evaporation or IJP inkjet printing, so that the organic light-emitting layer 15 is broken at an area on the pixel defining layer 12 adjacent the auxiliary cathode layer 13, and disconnected from the auxiliary cathode layer 13. In the subsequent deposition of the cathode layer 16 by means of sputtering or the like, the film of the cathode layer 16 is continuously formed around the auxiliary cathode layer 13 on the pixel defining layer 12 due to the influence of the shadow effect of the inverted trapezoid, so that the cathode layer 16 laps with the auxiliary cathode layer 13.

In this example, by disposing a spacer column with an inverted trapezoidal cross-section, and the width of the top side of the inverted trapezoid being larger than the maximum width corresponding to the narrow side of the auxiliary cathode strip, the inverted trapezoidal spacer column disconnects the organic light-emitting layer from the auxiliary cathode layer during the formation process, so that the cathode layer continuously laps with the auxiliary cathode layer on the pixel defining layer. Since the auxiliary cathode layer disposed on the pixel defining layer corresponds to the non-display area, material with low resistivity can be selected for the auxiliary cathode layer. It is also possible to further reduce the resistance by increasing the thickness of the auxiliary cathode layer, and the IR Drop of the cathode layer lapping with the auxiliary cathode layer is also reduced accordingly. Thus the uniformity of the display brightness and the like of the screen can be improved, thereby improving the display quality of the screen.

Example 3

Example 3 of the present application provides a display device, including the array substrate described in any one of the above examples.

Example 4

Figure 3:
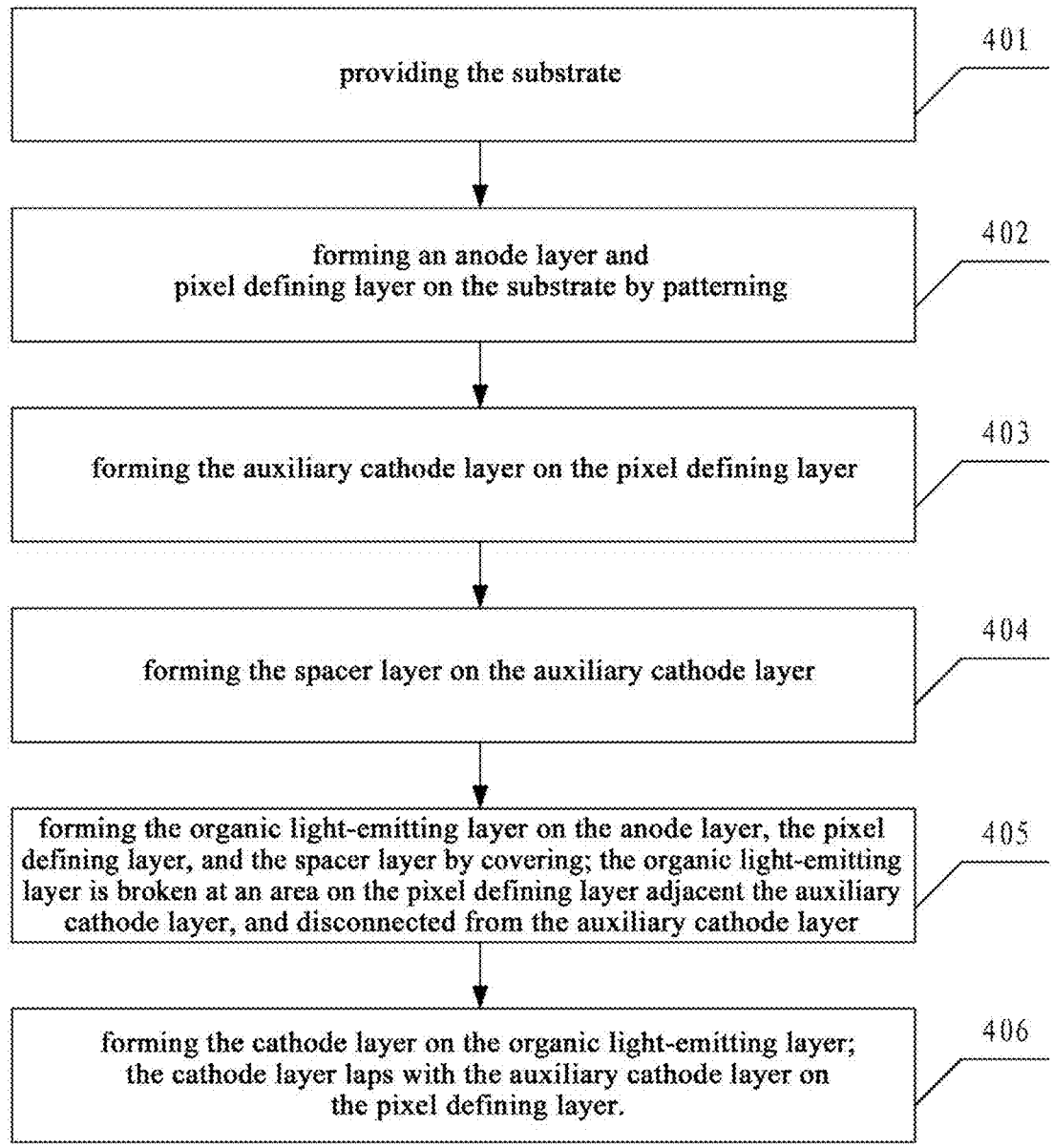
FIG. 3 is a flow chart showing the steps of a method for manufacturing the array substrate provided in example 4 of the present invention.

Referring to FIG. 3, it shows a flow chart of the steps of a method for manufacturing the array substrate provided in Example 4 of the present invention. The method is applied to the array substrate described in any one of the above examples, and the method includes:

Step 401: providing the substrate 10.

Figure 4:
FIG. 4 is a schematic diagram showing a profile structure of an array substrate in example 4 of the present invention after a substrate is formed.

Specifically, the step of providing the substrate 10 may include completing the fabrication of a thin film transistor array on the base substrate; and performing the fabrication of a planarization layer on the base substrate, wherein the material of the planarization layer may be the same as that of the PDL, and may be resin, SiNx, and the like, as shown in FIG. 4.

Step 402: forming the anode layer 11 and pixel defining layer 12 on the substrate 10 by patterning.

Figure 5:
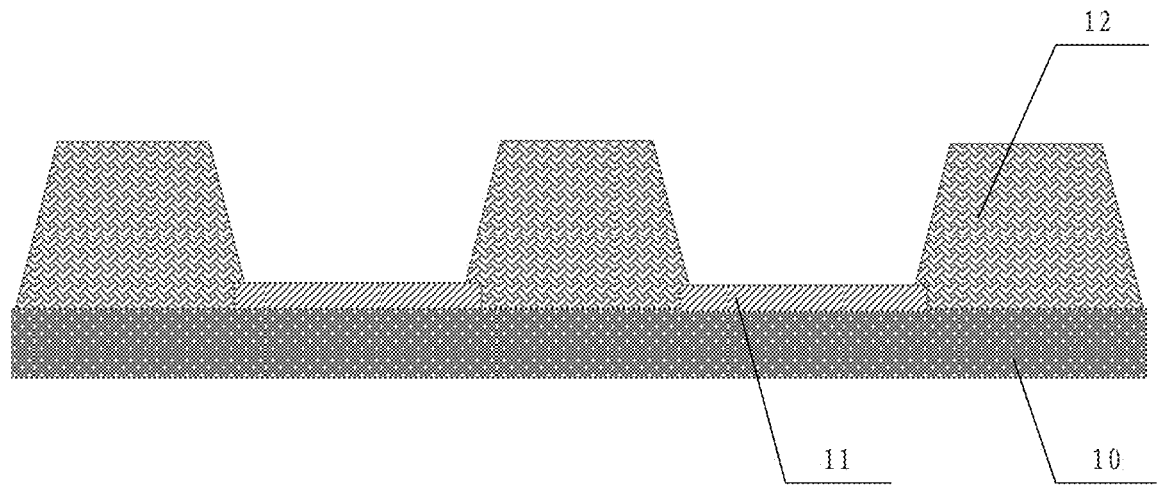
FIG. 5 is a schematic diagram showing a profile structure of an array substrate in example 4 of the present invention after an anode layer and a pixel defining layer are formed.

Specifically, the anode layer 11 can be formed by depositing materials such as ITO, and performing the fabrication of the ITO anode pattern through a photoetching process; then, the fabrication of the pixel defining layer 12 is completed by a photoetching process, and the pixel defining layer 12 has a thickness in a range of from 0.2 to 1.5 μm, as shown in FIG. 5.

Step 403: forming the auxiliary cathode layer 13 on the pixel defining layer 12.

Figure 6:
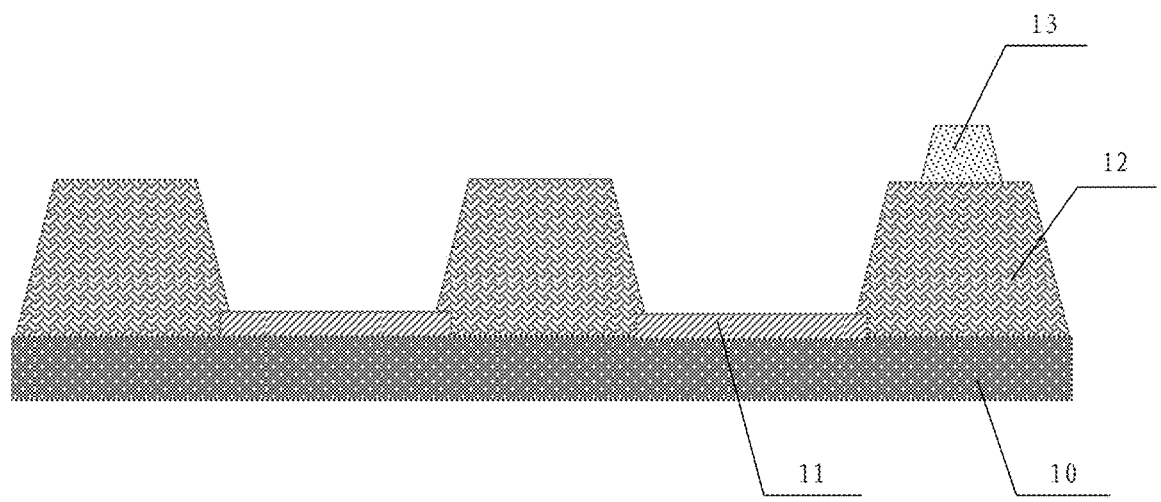
FIG. 6 is a schematic diagram showing a profile structure of an array substrate in example 4 of the present invention after an auxiliary cathode layer is formed.

Specifically, first the auxiliary cathode material is deposited, wherein the auxiliary cathode material may be a metal conductive material such as Mo, Mo/Al/Mo, Cu, Ag, and Nb, and the thickness of the auxiliary cathode layer 13 is 100-700 nm; and the fabrication of the auxiliary cathode layer 13 is performed by a photoetching process, as shown in FIG. 6.

Step 404: forming the spacer layer 14 on the auxiliary cathode layer 13.

Figure 7:
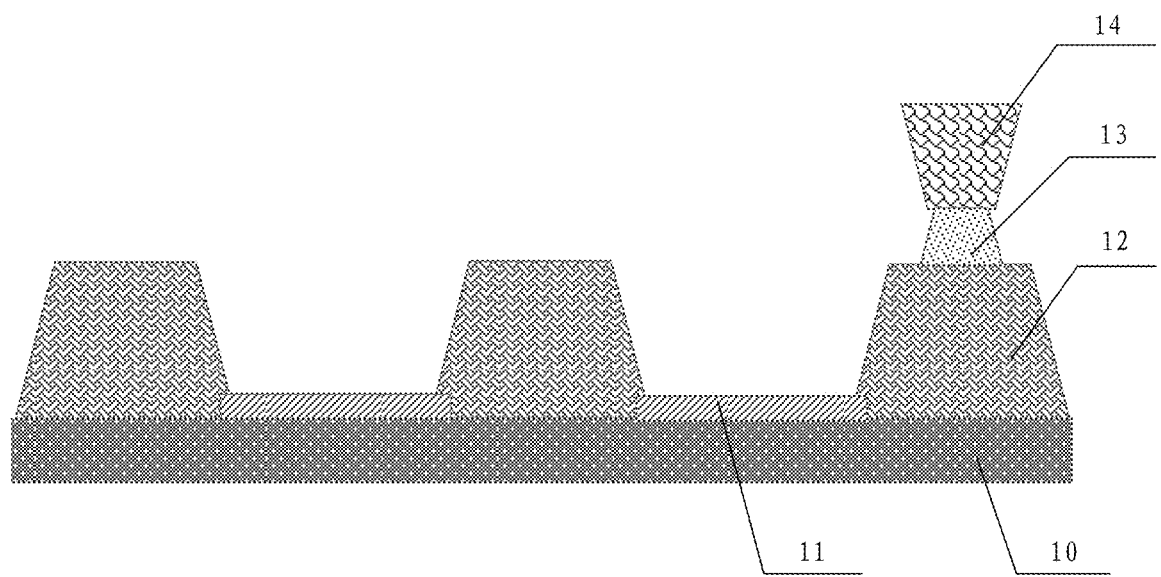
FIG. 7 is a schematic diagram showing a profile structure of an array substrate in example 4 of the present invention after a spacer layer is formed.

Specifically, the fabrication of the spacer layer 14 can be completed through a photoetching process, wherein the thickness of the spacer layer 14 is 0.29-4 μm, as shown in FIG. 7. In the figure, the cross section of the spacer layer 14 is exemplified as an inverted trapezoid.

Step 405: forming the organic light-emitting layer 15 on the anode layer 11, the pixel defining layer 12, and the spacer layer 14 by covering.

Figure 8:
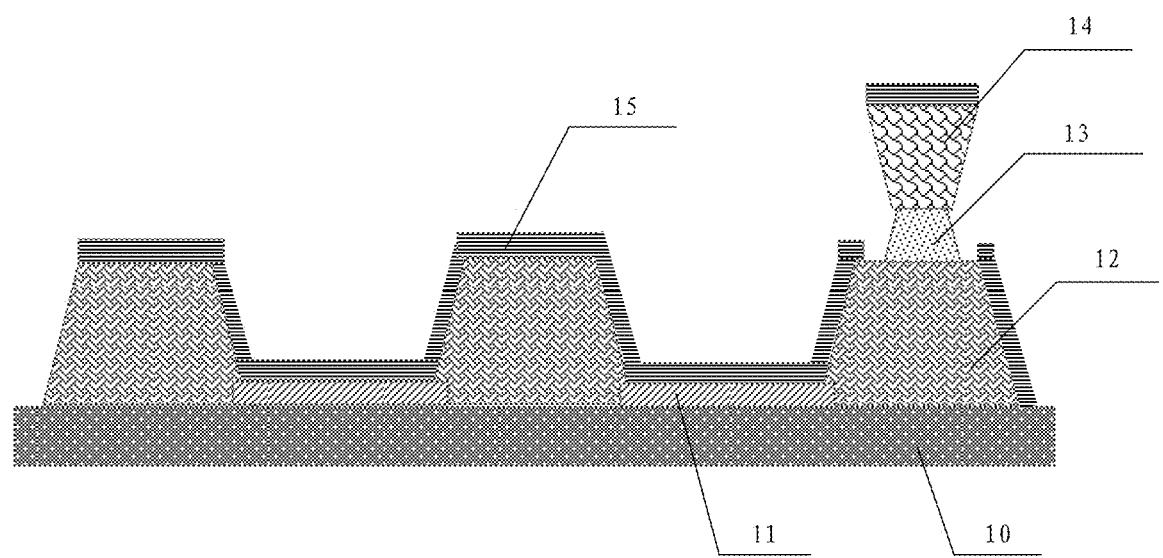
FIG. 8 is a schematic diagram showing a profile structure of an array substrate in example 4 of the present invention after an organic light-emitting layer is formed.

Specifically, the organic light-emitting layer 15 may be deposited by thermal evaporation or IJP inkjet printing. Since the spacer layer 14 is in a structure of inverted trapezoid, the spacer layer 14 is affected by the shadow effect of an inverted trapezoid during deposition. As a result, the organic light-emitting layer 15 is broken at an area on the pixel defining layer 12 adjacent the auxiliary cathode layer 13, and is disconnected from the auxiliary cathode layer 13, as shown in FIG. 8.

Step 406: forming the cathode layer 16 on the organic light-emitting layer 15; the cathode layer 16 laps with the auxiliary cathode layer 13 on the pixel defining layer 12.

Specifically, the cathode layer 16 may be a single-layer cathode composed of a material such as IZO, ITO, AZO, and the like, and the single-layer cathode is formed by a process such as sputtering; and the cathode layer 16 may also be a composite cathode composed of a first layer of cathode material such as Mg:Ag, Ag, and the like, and a material such as IZO, ITO, AZO, and the like, wherein the film of the first layer of cathode material such as Mg:Ag, Ag, and the like is formed by thermal evaporation process; and the film of the materials such as IZO, ITO, and AZO, and the like is formed by a process such as sputtering or other processes. When the cathode layer 16 is a single-layer cathode, the thickness should be 300-1,000 nm; when the cathode layer 16 is a composite cathode, the first layer cathode material is required to be on the side of the organic layer and the thickness is 2-20 nm, and the cathode materials such as IZO, ITO, AZO and the like cover the first layer cathode material and the thickness is in the range of 300-1000 nm.

By disposing an inverted trapezoidal spacer layer 14, during the deposition of the film layer, on one hand, since the shadow effect of sputter film formation is more obvious than that of evaporation film formation, the film of the cathode layer 16 is continuously formed around the auxiliary cathode layer 13 on the pixel defining layer 12 so that the cathode layer 16 laps with the auxiliary cathode layer 13. On the other hand, in actual film formation, the film thickness of the cathode layer 16 may be larger than the film thickness of the organic light-emitting layer 15, making it easier to continuously form a film around the auxiliary cathode layer 13, as shown in FIG. 1.

Optionally, a sputtering process for fabricating the top-emitting cathode layer 16 adopts a low temperature process (typical process temperature is generally required to be less than 80° C.), and a buffer layer (the material thereof can be Mg:Ag, Ag, and the like) may be added between the organic light-emitting layer 15 and the sputtering cathode layer 16. It is also possible to improve the structure of the sputtering apparatus and the like so as to reduce the influence of the sputtering process on the device performance.

Figure 9:
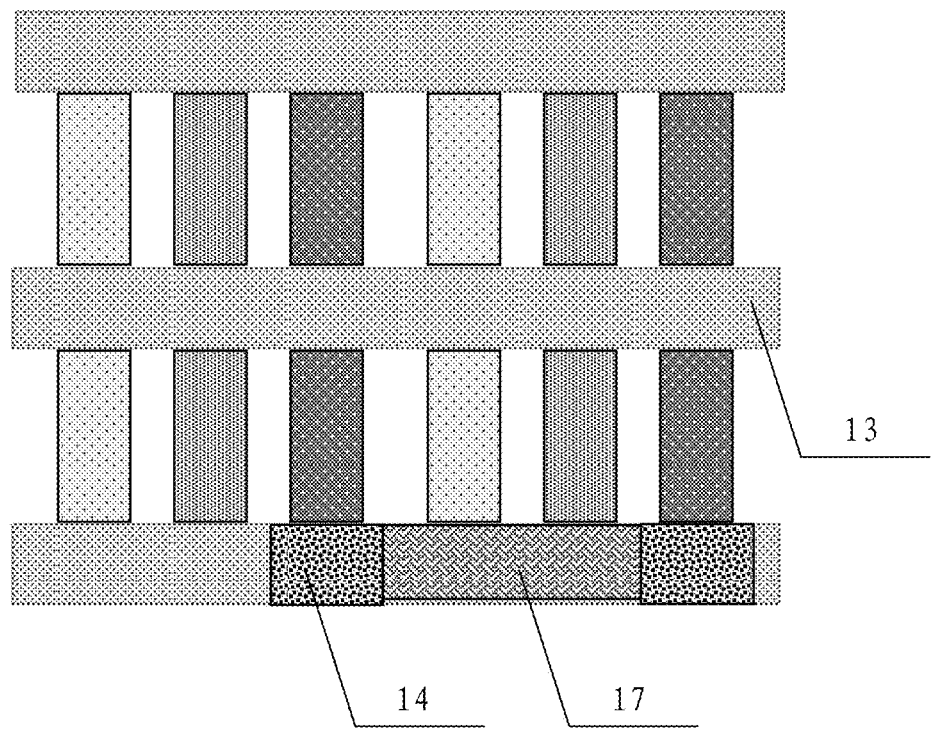
FIG. 9 is a schematic diagram showing a profile structure of an array substrate in example 4 of the present invention after an insulating layer is formed.
Figure 10:
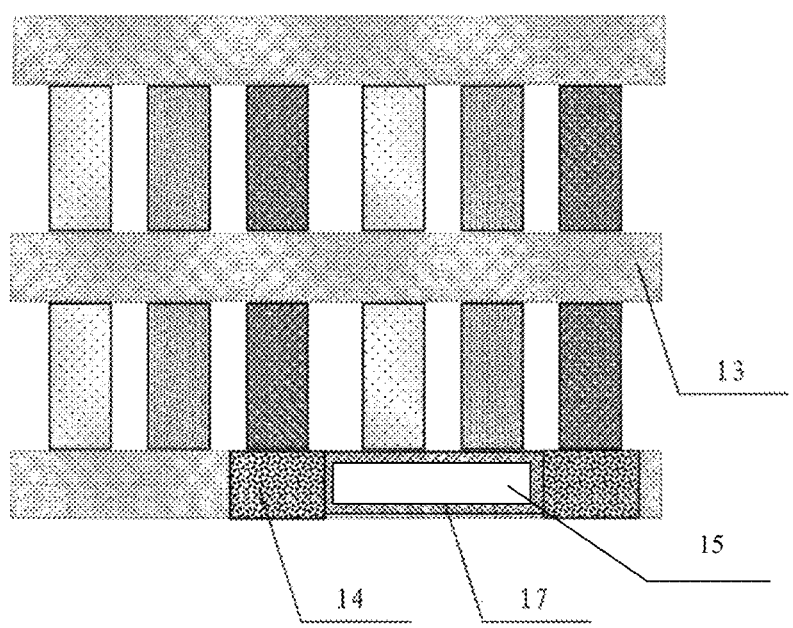
FIG. 10 is a schematic diagram showing a profile structure of an array substrate in example 4 of the present invention after an organic light-emitting layer is formed.

In another alternative example, in order to prevent short circuit caused by the contact of the exposed portion of the auxiliary cathode layer 13 with the organic light-emitting layer 15, the method further includes the following steps after step 404 and before step 406:

Step 501: covering an insulating layer 17 on the auxiliary cathode layer 13, and the insulating layer 17 is located on an area of the auxiliary cathode layer 13 that is not covered by the spacer layer 14, as shown in FIG. 9.

In order to distinguish the structures of different layers, FIG. 9 only shows a schematic view of a planar structure of a portion of the auxiliary cathode layer 13 covered by the insulating layer 17. In practical application, the insulating layer 17 may be disposed on all areas that are not covered by the orthogonal projection of the spacer layer 14 on the substrate 10. The insulating layer 17 may be an organic photoresist layer or an inorganic insulation layer.

Step 502: forming an organic light-emitting layer 15 on the anode layer 11, the pixel defining layer 12, the insulating layer 17, and the spacer layer 14 by covering.

According to the above method for manufacturing the array substrate, the above array substrate and the display device, since the auxiliary cathode layer disposed on the pixel defining layer corresponds to the non-display area, the material with low resistivity can be selected for the auxiliary cathode layer. It is also possible to further reduce the resistance by increasing the thickness of the auxiliary cathode layer, and the IR Drop of the cathode layer lapping with the auxiliary cathode layer is also reduced accordingly. Thus the uniformity of the display brightness and the like of the screen can be improved, thereby improving the display quality of the screen.

Each example in this specification is described in a progressive manner, each example focuses on the differences from the other examples, and the same or similar parts among the examples can be referred to each other.

Finally, it should also be noted to explain is that in this application, relational terms such as first and second, and the like are only used to distinguish one entity or operation from another entity or operation, and does not necessarily require or imply that there is any such actual relationship or order exists between these entities or operations. Moreover, the terms "comprise", "include," or any other variation thereof are intended to cover a non-exclusive inclusion so that the process, method, goods, or equipment that includes a range of elements include not only those elements but also other elements that are not explicitly listed, or also include elements that are inherent to such process, method, goods, or equipment. In the absence of more limitations, the elements defined by the sentence "include one . . . " do not exclude the presence of additional identical elements in the process, method, product, or device that includs the elements.

The array substrate, the method for manufacturing the array substrate and the display device provided by the present invention are described in detail above. The principle and embodiments of the present invention are described in specific examples in this application, but the above examples are only used to help understand the method and the core idea of the present invention. Meanwhile, for those skilled in the art, according to the idea of the present invention, there will be changes in the specific examples and the application range. In summary, the contents of this specification should not be construed as limiting the invention.

The invention claimed is:

1. An array substrate, comprising:
a substrate;
an anode layer and a pixel defining layer on the substrate;
an auxiliary cathode layer on the pixel defining layer;
a spacer layer on the auxiliary cathode layer, wherein the spacer layer includes a plurality of spacer columns on the auxiliary cathode layer, a cross section of the spacer columns along a first direction is an inverted trapezoid, and the first direction is the direction of a connecting-line of centers of adjacent pixel units, wherein the short side of the inverted trapezoid is adjacent to the auxiliary cathode layer;

an organic light-emitting layer covering the anode layer, the pixel defining layer, and the spacer layer;

a cathode layer covering the organic light-emitting layer; and an insulating layer formed between the auxiliary cathode layer and the organic light-emitting layer, the insulating layer is on an area of the auxiliary cathode layer that is not covered by the spacer columns;

wherein the cathode layer laps with the auxiliary cathode layer on the pixel defining layer, and wherein an orthogonal projection of the pixel defining layer on the substrate covers an orthogonal projection of the auxiliary cathode layer and the spacer layer on the substrate, the pixel defining layer divides a plurality of pixel units arranged in an array on the substrate, and in a direction of a connecting-line of centers of adjacent pixel units, the orthogonal projection of the spacer layer on the substrate covers the orthogonal projection of the auxiliary cathode layer on the substrate.

2. The array substrate according to claim 1, wherein the material of the auxiliary cathode layer is a metal conductive material, and the thickness of the auxiliary cathode layer is 100-700 nm.

3. A display device, comprising the array substrate according to claim 2.

4. The array substrate according to claim 1, wherein the thickness of the spacer layer is 0.2-4 μm.

5. A display device, comprising the array substrate according to claim 4.

6. A display device, comprising the array substrate according to claim 1.

7. A method for manufacturing the array substrate according to claim 1, comprising:
   providing the substrate;
   forming the anode layer and the pixel defining layer on the substrate by patterning;
   forming the auxiliary cathode layer on the pixel defining layer;
   forming the spacer layer on the auxiliary cathode layer, wherein the spacer layer includes a plurality of spacer columns on the auxiliary cathode layer, a cross section of the spacer columns along a first direction is an inverted trapezoid, and the first direction is the direction of a connecting-line of centers of adjacent pixel units, wherein the short side of the inverted trapezoid is adjacent to the auxiliary cathode layer;
   forming the organic light-emitting layer on the anode layer, the pixel defining layer, and the spacer layer by covering;
   forming an insulating layer between the auxiliary cathode layer and the organic light-emitting layer the insulating layer is on an area of the auxiliary cathode layer that is not covered by the spacer columns; and
   forming the cathode layer on the organic light-emitting layer;
   wherein the cathode layer laps with the auxiliary cathode layer on the pixel defining layer, and wherein an orthogonal projection of the pixel defining layer on the substrate covers an orthogonal projection of the auxiliary cathode layer and the spacer layer on the substrate;
   the pixel defining layer divides a plurality of pixel units arranged in an array on the substrate, and in a direction of a connecting-line of centers of adjacent pixel units, the orthogonal projection of the spacer layer on the substrate covers the orthogonal projection of the auxiliary cathode layer on the substrate.

8. The method according to claim 7, wherein the step of forming the organic light-emitting layer by covering comprises:
   forming the organic light-emitting layer by thermal evaporation or inkjet printing so that the organic light-emitting layer is broken at an area on the pixel defining layer adjacent the auxiliary cathode layer, and disconnected from the auxiliary cathode layer.

9. The method according to claim 7, wherein the step of forming the cathode layer comprises:
   forming the cathode layer by a sputtering process so that the cathode layer laps with the auxiliary cathode layer on the pixel defining layer.

* * * * *